United States Patent
Yoon et al.

(10) Patent No.: US 10,403,846 B2
(45) Date of Patent: Sep. 3, 2019

(54) ORGANIC LIGHT-EMITTING DIODE DISPLAY

(71) Applicant: Samsung Display Co., Ltd., Yongin-si, Gyeonggi-do (KR)

(72) Inventors: Juwon Yoon, Yongin-si (KR); Sewan Son, Yongin-si (KR); Iljeong Lee, Yongin-si (KR); Jiseon Lee, Yongin-si (KR); Deukmyung Ji, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 67 days.

(21) Appl. No.: 15/359,452

(22) Filed: Nov. 22, 2016

(65) Prior Publication Data

US 2017/0148863 A1     May 25, 2017

(30) Foreign Application Priority Data

Nov. 23, 2015   (KR) ......................... 10-2015-0163978

(51) Int. Cl.
    *H01L 51/52*      (2006.01)
    *H01L 51/50*      (2006.01)
    *H01L 27/32*      (2006.01)

(52) U.S. Cl.
CPC ...... *H01L 51/5234* (2013.01); *H01L 27/3258* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 2251/558* (2013.01)

(58) Field of Classification Search
CPC ...... H01L 51/50; H01L 51/5203; H01L 33/44
See application file for complete search history.

(56) References Cited

U.S. PATENT DOCUMENTS

| | | | |
|---|---|---|---|
| 6,538,390 B2 * | 3/2003 | Fujita | H01L 27/3248 257/350 |
| 2007/0171144 A1 | 7/2007 | Tanada | |
| 2013/0221381 A1 * | 8/2013 | Shin | H01L 27/1255 257/88 |
| 2013/0328479 A1 * | 12/2013 | Jung | G02B 5/0278 313/504 |
| 2014/0117341 A1 * | 5/2014 | Song | H01L 51/0097 257/40 |
| 2015/0014638 A1 | 1/2015 | Kwon et al. | |

(Continued)

FOREIGN PATENT DOCUMENTS

| JP | 2014-45166 A | 3/2014 |
|---|---|---|
| KR | 10-2007-0074469 A | 7/2007 |

(Continued)

*Primary Examiner* — Jamie C Niesz
(74) *Attorney, Agent, or Firm* — F. Chau & Associates, LLC (57) ABSTRACT

An organic light-emitting diode (OLED) display is disclosed. In one aspect, the OLED display includes a substrate, an interlayer insulating layer arranged over the substrate and an OLED arranged over the interlayer insulating layer. The OLED display also includes a source electrode and a drain electrode arranged over the interlayer insulating layer and a via layer arranged over the interlayer insulating layer and having a via hole exposing the source electrode or the drain electrode. The interlayer insulating layer includes a projecting portion which projects toward the OLED in the via hole.

20 Claims, 3 Drawing Sheets (56) References Cited

U.S. PATENT DOCUMENTS

2015/0029429 A1  1/2015  Choi et al.
2015/0138463 A1  5/2015  Jinta et al.

FOREIGN PATENT DOCUMENTS

KR  10-2008-0098278 A  11/2008
KR  10-2015-0007745 A  1/2015
KR  10-2015-0014563 A  2/2015

* cited by examiner

ORGANIC LIGHT-EMITTING DIODE DISPLAY

CROSS-REFERENCE TO RELATED APPLICATION

This application claims the benefit of Korean Patent Application No. 10-2015-0163978, filed on Nov. 23, 2015, in the Korean Intellectual Property Office, the disclosure of which is incorporated herein in its entirety by reference.

BACKGROUND

Field

The described technology generally relates to an organic light-emitting diode (OLED) display.

Description of the Related Technology

An OLED display includes many self-emissive OLEDs each having a hole-injecting electrode, an electron-injecting electrode, and an interposed organic light-emitting layer. The organic light-emitting layer emits light as excitons generated as holes injected by the hole-injecting electrode and electrons injected by the electron-injecting electrode combine with each other in the organic light-emitting layer transit from an excited state to a ground state. Each OLED is driven by a pixel circuit and the combination of OLEDs is used to display images.

An OLED display has desirable characteristics including a wide viewing angle, high contrast, low power consumption, thin profile, lightweight and fast response speeds. Therefore, OLED technology is being targeted for use in next-generation displays.

SUMMARY OF CERTAIN INVENTIVE ASPECTS

One inventive aspect relates to an OLED display having an increased aperture ratio.

Another aspect is an OLED display that includes a substrate, an interlayer insulating layer arranged on the substrate, a source electrode and a drain electrode arranged on the interlayer insulating layer, and a via layer arranged on the interlayer insulating layer and including a via hole exposing the source electrode or the drain electrode, wherein the interlayer insulating layer includes a projecting portion which projects upward in the via hole.

A part of the source electrode or the drain electrode may be arranged on the projecting portion in the via hole.

The OLED display may further include a first electrode arranged flat on the via layer without a step.

A flat lower surface of the first electrode may contact a flat upper surface of the source electrode or the drain electrode in the via hole.

The source electrode or the drain electrode may include an upper surface which is flush with an upper surface of the via layer in the via hole.

A height of the projecting portion may be less than that of the via layer.

A difference between the height of the via layer and that of the projecting portion may be a height of the source electrode or the drain electrode.

The OLED display may further include a pixel defining layer arranged on the via layer, wherein the pixel defining layer may include an opening exposing a part of the first electrode.

The projecting portion and one of the source electrode and the drain electrode may be arranged in the via hole.

Another aspect is an OLED display that includes a substrate, an interlayer insulating layer arranged on the substrate, a source electrode and a drain electrode arranged on the interlayer insulating layer, a via layer arranged on the interlayer insulating layer and including a via hole exposing the source electrode or the drain electrode, and a first electrode arranged flat on the via layer without a step, wherein the interlayer insulating layer may include a projecting portion which projects upward in the via hole.

Another aspect is an organic light-emitting diode (OLED) display, comprising: a substrate; an interlayer insulating layer arranged over the substrate; an OLED arranged over the interlayer insulating layer; a source electrode and a drain electrode arranged over the interlayer insulating layer; and a via layer arranged over the interlayer insulating layer and having a via hole exposing the source electrode or the drain electrode, wherein the interlayer insulating layer comprises a projecting portion which projects in a direction perpendicular to the substrate in the via hole.

In the above OLED display, a part of the source electrode or the drain electrode is arranged over the projecting portion in the via hole. The above OLED display further comprises: a first electrode arranged flat on the via layer without a step. In the above OLED display, a flat lower surface of the first electrode contacts a flat upper surface of the source electrode or the drain electrode in the via hole. In the above OLED display, the source electrode or the drain electrode comprises a first upper surface, wherein the distance between the substrate and the first upper surface is the same as the distance between the substrate and an upper surface of the via layer.

In the above OLED display, the projecting portion has a height less than that of the via layer. In the above OLED display, the interlayer insulating layer includes a body from which the projecting portion projects, and wherein the height of the projecting portion is greater than that of the body. In the above OLED display, the source electrode or the drain electrode has a height which is the same as the difference between the height of the via layer and that of the projecting portion. The above OLED display further comprises: a pixel defining layer arranged over the via layer, wherein the pixel defining layer has an opening exposing a part of the first electrode. In the above OLED display, the projecting portion and one of the source and drain electrodes are arranged in the via hole. In the above OLED display, a top surface of the projecting portion is higher than a top surface of the source or drain electrode.

In the above OLED display, the source electrode or the drain electrode entirely covers the projecting portion. In the above OLED display, a top surface of the projecting portion is higher than a top surface of the source or drain electrode. The above OLED display further comprises: a thin film transistor (TFT) including the source and drain electrodes and formed over the substrate, wherein the TFT further includes: an active layer formed over the substrate; a gate insulating layer formed on the active layer; and a gate electrode interposed between the gate insulating layer and the interlayer insulating layer, wherein the projecting portion overlaps neither the active layer nor the gate electrode in the depth dimension of the OLED display.

Another aspect is an organic light-emitting diode (OLED) display, comprising: a substrate; an interlayer insulating layer arranged over the substrate; an OLED arranged over the interlayer insulating layer; a source electrode and a drain electrode arranged over the interlayer insulating layer; a via layer arranged over the interlayer insulating layer and having a via hole exposing the source electrode or the drain electrode; and a first electrode arranged flat over the via layer without a step, wherein the interlayer insulating layer comprises a projecting portion which projects in a direction perpendicular to the substrate in the via hole.

In the above OLED display, the projecting portion has a height less than that of the via layer. In the above OLED display, the interlayer insulating layer includes a body from which the projecting portion projects, and wherein the height of the projecting portion is greater than that of the body. In the above OLED display, the source electrode or the drain electrode entirely covers the projecting portion.

Another aspect is an organic light-emitting diode (OLED) display, comprising: a substrate; an interlayer insulating layer arranged over the substrate; an OLED arranged over the interlayer insulating layer; a source electrode and a drain electrode arranged over the interlayer insulating layer; and a via layer arranged over the interlayer insulating layer and having a via hole exposing the source electrode or the drain electrode, wherein the interlayer insulating layer comprises a body and a projection extending from the body in a direction perpendicular to the substrate in the via hole so as to overlap the OLED in the depth dimension of the OLED display.

In the above OLED display, a top surface of the projection is higher than a top surface of the source or drain electrode.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

A typical pixel electrode of an OLED display has a step structure that with aging from thermoelectric effects can be degraded. Thus, structural degradation affects the lifetime of the display, and therefore, the light-emitting capability diminishes with time.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of" when preceding a list of elements, modify the entire list of elements and do not modify the individual elements of the list.

Hereinafter, embodiments will be described in detail with reference to the accompanying drawings. The same reference numerals are used to denote the same elements, and repeated descriptions thereof will be omitted.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

Sizes of elements in the drawings may be exaggerated for convenience of explanation. In other words, since sizes and thicknesses of components in the drawings are arbitrarily illustrated for convenience of explanation, the described technology is not limited thereto.

When a certain embodiment may be implemented differently, a specific process order may be performed differently from the described order. For example, two consecutively described processes may be performed substantially at the same time or performed in an order opposite to the described order.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 1:
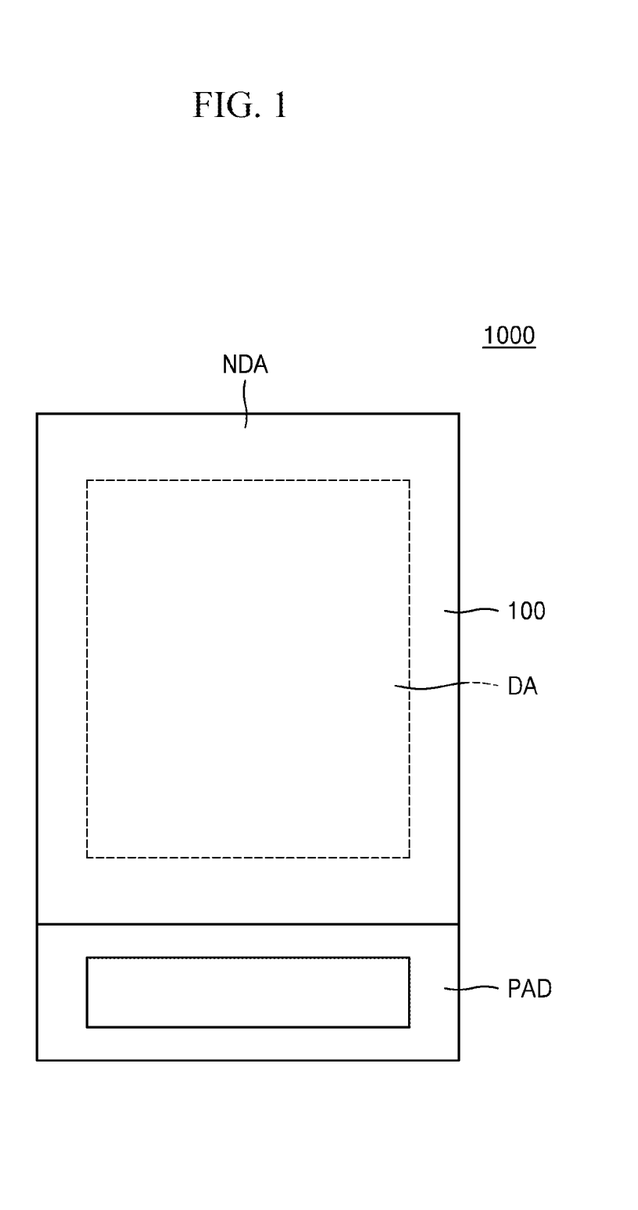
FIG. 1 is a plan view of a display device according to one or more embodiments.

FIG. 1 is a plan view of a display device 1000 according to one or more embodiments.

The display device includes a substrate 100. The substrate may be formed of various materials with flexibility and may be formed of plastic materials with good heat-resistance and durability.

The substrate 100 may include a display area DA implementing images that a user may recognize, and a non-display area NDA which is an area outside the display area DA.

The display area DA may include various elements such as an organic light emitting element and a liquid crystal display element which generating light, and voltage lines supplying electrical power to the display area DA may be arranged in the non-display area NDA.

In addition, the non-display area NDA may include a pad unit PAD, which may transfer electrical signals from a power supply (not illustrated) or a signal generator (not illustrated) to the display area DA.

The pad unit PAD may include a driver integrated circuit (IC) (not illustrated), a pad (not illustrated) connecting the driver IC and pixel circuits to each other, and a fan-out wiring (not illustrated).

Figure 2:
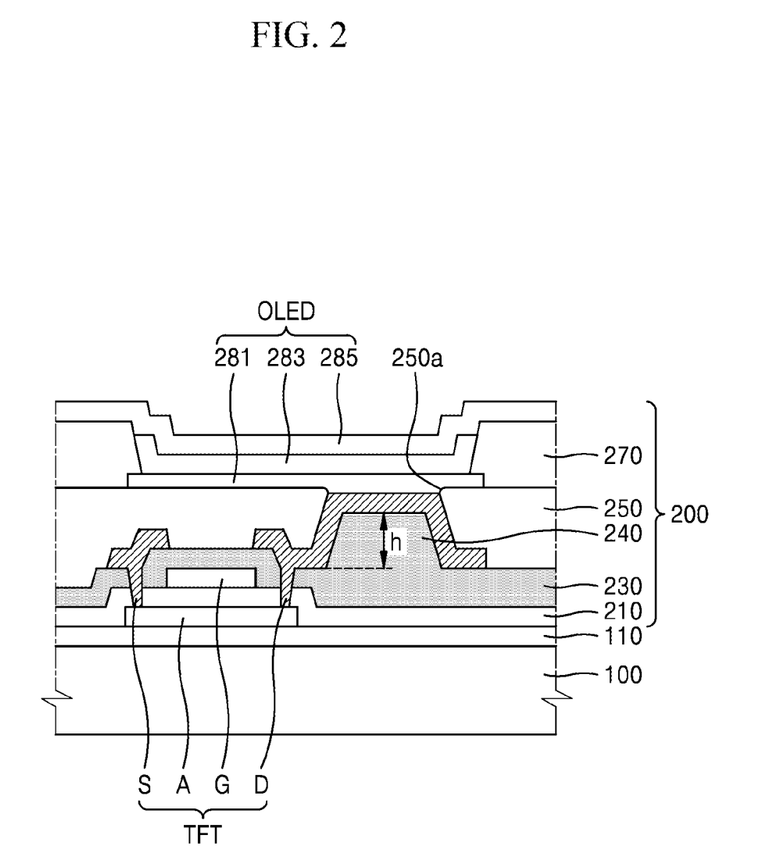
FIG. 2 is a schematic sectional view of the display device illustrated in FIG. 1.

FIG. 2 is a schematic sectional view of the display device 1000 illustrated in FIG. 1.

The display device 1000 includes the substrate 100 and a display unit 200 provided on the substrate 100, according to the present embodiment.

The substrate 100 may include various materials as described above. In another embodiment, the substrate 100 may include transparent glass materials having $SiO_2$ as a main component. However, the described technology is not limited thereto and the substrate 100 may include transparent plastic materials also. The transparent plastic materials may include at least one of insulating organic materials such as polyethersulphone (PES), polyacrylate (PAR), polyetherimide (PEI), polyethylene napthalate (PEN), polyethylene terephthalate (PET), polypheylene sulfide (PPS), polyallylate, polyimide, polycarbonate (PC), cellulose triacetate (TAC) and cellulose acetate propionate (CAP).

The substrate 100 can have a flexible property and thus, may elongate two-dimensionally.

In another embodiment, the substrate 100 is formed of materials having the Poisson's ratio of about 0.4 or more.

The Poisson's ratio denotes the ratio of transverse contraction strain to longitudinal extension strain in the direction of stretching force.

The flexibility of the substrate 100 may be enhanced and accordingly the display device 1000 may be easily bendable or foldable by ensuring that materials forming the substrate 100 have a Poisson's ratio of about 0.4 or more, that is, the substrate 100 has a good stretching property.

The display unit 200 may be arranged over the substrate 100.

The display unit 200 may emit visible light so that a user may view images thereon. The display unit 200 may include various elements, for example, an organic light-emitting diode OLED or the liquid crystal display element, etc.

The display unit 200 may include an OLED, and a detailed description thereof will be provided below.

A buffer layer 110 may be disposed over the substrate 100. The buffer layer 110 may prevent a dispersion of ions of impurities, prevent an invasion of moisture or outside air, and function as a barrier layer and/or a blocking layer to flatten a surface of the substrate 100.

The buffer layer 110 may include an inorganic layer and be arranged over the entire top surface of the substrate 100.

A thin film transistor TFT may be arranged over the buffer layer 110. An active layer A of the thin film transistor TFT may be formed of polysilicon and may include a channel region doped that is not doped with impurities, and a source region and a drain region respectively formed on one side of the channel region and respectively doped with impurities thereon. Impurities may vary depending on a kind of the thin film transistor TFT and may include n-type impurities or p-type impurities.

A gate insulating layer 210 may be formed on the active layer A after the active layer A has been formed.

The gate insulating layer 210 may include inorganic materials such as silicon oxides and silicon nitrides, and may include a single layer or layers. The gate insulating layer 210 may play a role of insulating the active layer A and a gate electrode G arranged on the gate insulating layer 210 from each other.

The gate insulating layer 210 may include an inorganic layer and be arranged on the entire top surface of the substrate 100.

A gate electrode G may be formed on the gate insulating layer 210 after the gate insulating layer 210 has been formed. The gate electrode G may be formed via a photolithography process and an etching process.

Materials for the gate electrode G may include at least one of metals selected from Mo, Al, Pt, Pd, Ag, Mg, Au, Ni, Nd, Ir, Cr, Li, Ca, Ti, W, and Cu.

An interlayer insulating layer 230 may be formed on the entire surface of the substrate 100 and cover the gate electrode G, after the gate electrode G has been formed.

The interlayer insulating layer 230 may include inorganic materials. For example, the interlayer insulating layer 230 is metal oxides or metal nitrides. The inorganic materials may include $SiO_2$, $SiN_x$, $SiON$, $Al_2O_3$, $TiO_2$, $Ta_2O_5$, $HfO_2$ or $ZrO_2$.

The interlayer insulating layer 230 may be formed of inorganic materials such as silicon oxides (SiOx) and/or silicon nitrides (SiNx), and may include a single layer or layers. In some embodiments, the interlayer insulating layer 230 may be configured to have a dual structure of SiOx/SiNy or SiNx/SiOy.

The interlayer insulating layer 230 may include a projecting portion or projection 240.

The projecting portion 240 may be a part of the interlayer insulating layer 230 that projects away from the substrate 100.

The projecting portion 240 as part of the interlayer insulating layer 230 may have a prescribed height h.

A detailed description with respect to the projecting portion 240 will be described below.

A source electrode S and a drain electrode D of the thin film transistor TFT may be arranged on the interlayer insulating layer 230.

The source electrode S and the drain electrode D may include at least one of metals selected from Al, Pt, Pd, Ag, Mg, Au, Ni, Nd, Ir, Cr, Li, Ca, Mo, Ti, W and Cu.

The source electrode S and the drain electrode D may contact the active layer A through contact holes formed in the gate insulating layer 210 and the interlayer insulating layer 230.

The source electrode S or the drain electrode D may be formed over the interlayer insulating layer 230 and may cover the projecting portion 240.

For example, as a part of the interlayer insulating layer 230 includes the projecting portion 240, and the source electrode S and the drain electrode D are arranged over the interlayer insulating layer 230, some parts of the source electrode S or the drain electrode D may be formed over the projecting portion 240.

A via layer 250 may be configured to cover the source electrode S and the drain electrode D.

A first electrode 281 may be formed on the via layer 250. The first electrode 281 may be connected to the drain electrode D through a via hole 250a according to an embodiment illustrated in FIG. 2.

The via layer 250 may be formed of insulating materials. For example, the via layer 250 may include inorganic materials, organic materials or a combination of organic/inorganic materials, have a single or a multilayer structure, and be formed via various deposition methods. In some embodiments, the via layer 250 includes at least one of polyacrylate resin, epoxy resin, phenolic resin, polyamide resin, polyimide resin, unsaturated polyester resin, polyphenylene resin, polyphenylene sulfide resin, and benzocyclobutene (BCB).

As described above, in the display device 1000, the projecting portion 240 as a part of the interlayer insulating layer 230 may project upward in the via hole 250a according to the present embodiment.

Furthermore, as the source electrode S or the drain electrode D is arranged over the interlayer insulating layer 230 and covers the projecting portion 240, the projecting portion 240 and the source electrode S or the drain electrode D may completely fill the via hole 250a.

For example, an upper surface of the via layer 250 is substantially flat.

According to another embodiment, the projecting portion 240 has a prescribed height h. The height h may be greater than that of a body (non-projecting portion) of the via layer 250 formed below the projecting portion 240.

According to another embodiment, the height h of the projecting portion 240 is not higher than and is similar to a height of the via layer 250.

As illustrated in FIG. 2, in the display device 1000, the drain electrode D may be formed on the projecting portion 240 to cover the same, and thus, an upper surface of the drain electrode D covering the projecting portion 240 may be flush with the upper surface of the via layer 250 according to the present embodiment.

As the upper surface of the drain electrode D covering the projecting portion 240 is flush with the upper surface of the via layer 250, the upper surface of the via layer 250 may be substantially flat in the via hole 250a. For example, as shown in FIG. 2, the distance between the substrate 100 and the upper surface of the drain electrode D covering the projecting portion 240 is substantially the same as the distance between the substrate 100 and the upper surface of the via layer 250.

The OLED may be arranged over the via layer 250.

The OLED may include the first electrode 281, an intermediate layer 283 including an organic light emitting layer, and a second electrode 285. In addition, the display device 1000 may further include a pixel defining layer 270.

Holes and electrons injected from the first and second electrodes 281 and 285 of the OLED may be combined in the organic light emitting layer of the intermediate layer 283 and thus may generate light.

The first electrode 281 and/or the second electrode 285 may be provided as a transparent electrode or a reflective electrode. When the first and/or second electrode 281 and 285 are provided as a transparent electrode, the transparent electrode may include ITO, IZO, ZnO or $In_2O_3$. When the first and/or second electrode 281 and 285 are provided as a reflective electrode, the reflective electrode may include a reflective layer formed of Ag, Mg, Al, Pt, Pd, Au, Ni, Nd, Ir and Cr, or a compound of these metals, and a transparent layer formed of ITO, IZO, ZnO or $In_2O_3$. In some embodiment, the first electrode 281 or the second electrode 285 has a structure of ITO/Ag/ITO.

The intermediate layer 283 may be between the first and second electrodes 281 and 285, and may include the organic light emitting layer.

The intermediate layer 283 may include the organic light emitting layer and in addition, may further include at least one of a hole injection layer (HIL), a hole transport layer (HTL), an electron transport layer (ETL), and an electron injection layer (EIL). However, the described technology is not limited thereto and the intermediate layer 283 may include the organic light emitting layer and may further include other various functional layers.

The first electrode 281 may be a pixel electrode.

According to another embodiment, as illustrated in FIG. 2, a lower surface of the first electrode 281 is substantially flat.

For example, as the drain electrode D, which is connected to the first electrode 281, is formed on the projecting portion 240 in the via hole 250a, the first electrode 281 may be substantially flat without a step. FIG. 2 illustrates that the drain electrode D is connected to the first electrode 281 according to the present embodiment. However, the described technology is not limited thereto and the source electrode S may be connected to the first electrode 281.

When the first electrode 281 is formed in the via hole 250a and connected to the source electrode S or the drain electrode D, a step may be formed on the first electrode 281.

If the first electrode 281 has a step, portion where the step is formed may deteriorate. As a result, the portion where deterioration occurred may not be used as a light-emitting region due to a lifetime of the OLED and reliability of the display device.

Therefore, the portion where the step is formed in the first electrode 281 may not be used as a light-emitting region, and thus, an aperture ratio may be lowered.

According to the present embodiment, as the interlayer insulating layer 230 of the display device 1000 has the projecting portion 240 and some parts of the source electrode S or the drain electrode D is formed over the projecting portion 240, a step is not formed on the first electrode 281.

For example, as not the first electrode 281 but the source electrode S or the drain electrode D is in the via hole 250a and is flush with the upper surface of the via layer 250, the source electrode S or the drain electrode D may be connected to the first electrode 281.

Therefore, the first electrode 281 may be connected to the source electrode S or the drain electrode D as being formed substantially flat without a step on the via layer 250.

Deterioration may not occur due to a step of the electrode 281 according to the present embodiment. Therefore, a wider region including the via hole 250a may be used as a light-emitting region.

The display device may have a wider light-emitting region as the first electrode 281 is formed substantially flat without a step. Therefore, an aperture ratio may increase and a lifetime of the OLED and reliability of the display device may be improved.

The pixel defining layer 270 may be formed on the via layer 250.

The pixel defining layer 270 may define a pixel region and a non-pixel region. The pixel defining layer 270 may include an opening exposing a part of the first electrode and may cover the substrate 100. The opening may be a substantial pixel region as an intermediate layer 283 is formed in the opening.

Figure 3:
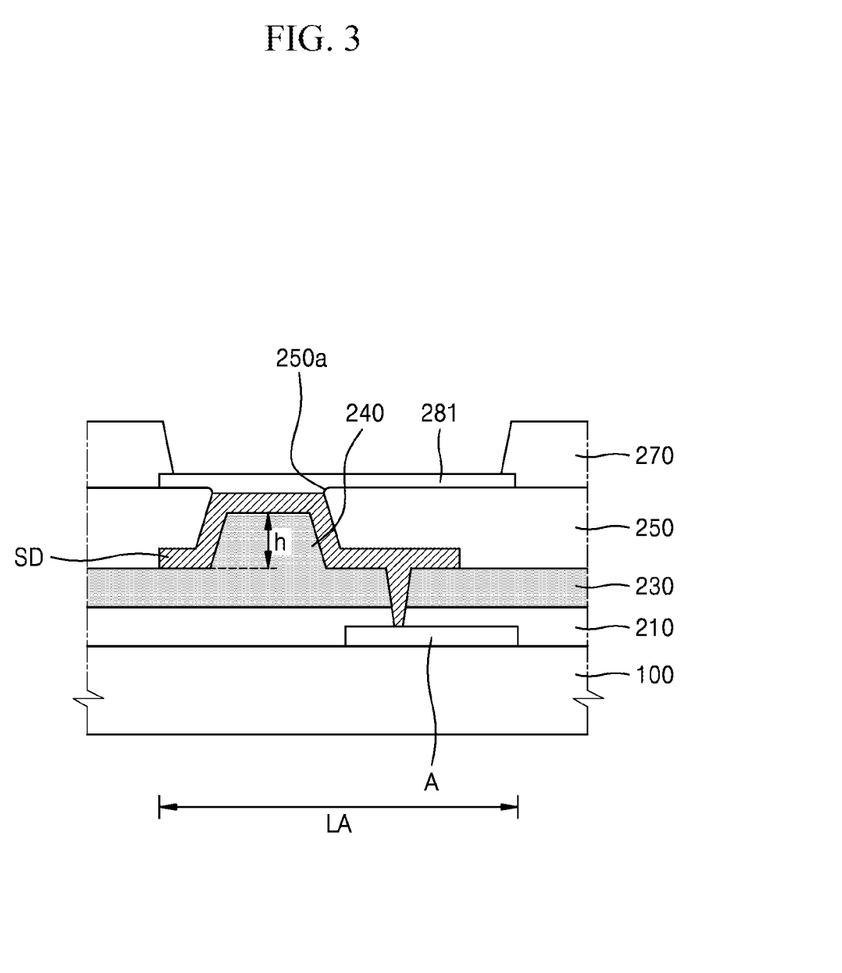
FIG. 3 is an enlarged sectional view of an interlayer insulating layer and a via layer illustrated in FIG. 2 as a center.

FIG. 3 is an enlarged sectional view of the interlayer insulating layer 230 and the via layer 250 illustrated in FIG. 2 as a center.

For convenience of explanation, FIG. 3 illustrates the source electrode S or the drain electrode D of FIG. 2 as a data line SD forming the source electrode S or the drain electrode D.

As described above, the active layer A and the gate insulating layer 210 may be disposed on the substrate 100, and the interlayer insulating layer 230 may be formed on the gate insulating layer 210.

The via layer 250 including the data line SD and the via hole 250a may be formed on the interlayer insulating layer 230, and the first electrode 281, which is connected to the data line SD, may be formed on the via layer 250.

A part of the interlayer insulating layer 230 may include the projecting portion 240 which projects upward.

According to another embodiment, the projecting portion 240 is formed in the via hole 250a.

The height h of the projecting portion 240 may be the same as or less than the height of the via layer 250.

An upper surface of the data line SD on the projecting portion 240 may be flush with the upper surface of the via layer 250.

As illustrated in FIG. 3, the display device may have the first electrode 281 be formed substantially flat on the via layer 250 without a step according to the present embodiment.

The upper surface of the via layer 250 and the data line SD may be substantially flat as the projecting portion 240 of the interlayer insulating layer 230 and the data line SD covering the projecting portion 240 are formed in the via hole 250a of the via layer 250. Furthermore, the first electrode 281 formed on the via layer 250 may be connected to the data line SD to be substantially flat without a step.

Therefore, a wider light-emitting region LA including the via hole 250a may be formed as deterioration due to a step of first electrode 281 does not occur.

FIG. 3 illustrates that a part of the first electrode 281 on the via layer 250 includes an opening exposing a part of the first electrode 281, wherein the opening corresponds to the light-emitting region LA.

However, the embodiment of FIG. 3 is only an example and the light-emitting region LA may be further widened.

The display device may have the first electrode 281 be formed substantially flat on the via layer 250 to be connected to the data line SD without a step according to the present embodiment. Therefore, an aperture ratio may increase and a lifetime of the OLED and reliability of the display device may be improved.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. An organic light-emitting diode (OLED) display, comprising;
    a substrate including a main surface;
    a first insulating layer disposed over the main surface of the substrate;
    a thin film transistor (TFT) disposed on the substrate, wherein the TFT comprises an active layer, a gate electrode, a source electrode and a drain electrode, wherein a selected one of the source and drain electrodes is disposed over the first insulating layer;
    a second insulating layer disposed over the first insulating layer and having a via hole exposing the selected electrode; and
    an OLED disposed over the second insulating layer,
    wherein the first insulating layer comprises a projecting portion which projects in a direction perpendicular to the substrate and is overlapped by the via hole, wherein a first height from the main surface of the substrate to a top surface of the projecting portion is greater than a second height from the main surface of the substrate to a top surface of a portion of the first insulating layer which overlaps the gate electrode.

2. The OLED display of claim 1, wherein a part of the selected electrode is disposed over the projecting portion and corresponds to the via hole.

3. The OLED display of claim 1, wherein the OLED comprises:
    a first electrode disposed substantially flat on the second insulating layer without a step;
    a light emission layer on the first electrode; and
    a second electrode on the light emission layer.

4. The OLED display of claim 3, wherein a substantially flat lower surface of the first electrode contacts an upper surface of the selected electrode through the via hole.

5. The OLED display of claim 1, wherein the selected electrode comprises a first upper surface, and wherein the distance between the substrate and the first upper surface is the same as the distance between the substrate and an upper surface of the second insulating layer.

6. The OLED display of claim 1, wherein the first height is less than a third height from the main surface of the substrate to a top surface of the second insulating layer.

7. The OLED display of claim 1, wherein the first insulating layer includes a body from which the projecting portion projects, and wherein the first height is greater than a height from the main surface of the substrate to a top surface of the body.

8. The OLED display of claim 6, wherein the selected electrode has a thickness which is the same as the difference between the third height and the first height.

9. The OLED display of claim 3, further comprising:
    a pixel layer disposed over the second insulating layer,
    wherein the pixel defining layer has an opening exposing a part of the first electrode.

10. The OLED display of claim 1, wherein the selected electrode entirely covers the projecting portion.

11. The OLED display of claim 1, wherein the projecting portion overlaps neither the active layer nor the gate electrode in a direction perpendicular to the substrate.

12. The OLED display of claim 1, wherein the projecting portion extends upwardly within the via hole.

13. The OLED display of claim 12, wherein the projecting portion extends to an upper portion of the via hole.

14. An organic light-emitting diode (OLED) display, comprising:
    a substrate;
    a first insulating layer disposed over the substrate;
    a thin film transistor (TFT) disposed on the substrate, wherein the TFT includes an active layer, a gate electrode, a source electrode and a drain electrode, wherein a selected one of the source and drain electrodes of TFT is disposed over the first insulating layer;
    a second insulating layer disposed over the selected electrode and having a via hole exposing the selected electrode; and
    an OLED disposed over the second insulating layer, the OLED including a first electrode, a light emission layer on the electrode, and a second electrode on the light emission layer, wherein the via hole is overlapped by the light emission layer,
    wherein the first insulating layer comprises a projecting portion which projects toward the OLED and is overlapped by the via hole, wherein a first height from a main surface of the substrate to a top surface of the projecting portion is greater than a second height from the main surface of the substrate to a top surface of a second portion of the first insulating layer which overlaps the gate electrode.

15. The OLED display of claim 14, wherein the first height is less than a height from the main surface of the substrate to a top surface of the second insulating layer.

16. The OLED display of claim 14, wherein the first insulating layer includes a body from which the projecting portion projects, and wherein the first height is greater than the height from the main surface of the substrate to the body.

17. The OLED display of claim 14, wherein the selected electrode entirely covers the projecting portion.

18. The OLED display of claim 14, wherein the projecting portion extends upwardly within the via hole.

19. An organic light-emitting diode (OLED) display, comprising:
    a substrate;
    a first insulating layer disposed over the substrate;
    a thin film transistor (TFT) disposed on the substrate, wherein the TFT includes an active layer, a gate electrode, a source electrode and a drain electrode, and wherein a selected one of the source and drain electrodes is disposed over the first insulating layer;

a second insulating layer disposed on the first insulating layer, and having a via hole exposing the selected electrode;

a first electrode disposed on the second insulating layer;

a pixel defining layer disposed on the first electrode and having an opening which overlaps a part of the first;

a light emission layer disposed on the first electrode through the opening, and a second electrode on the light emission layer;

wherein the first insulating layer comprises a projecting portion extending upwardly so as to be overlapped by the light emission layer, wherein a first height from as main substrate to a top surface of the projecting portion is greater than a second height from the main surface of the substrate to a top surface of a portion of the first insulating, layer which overlaps the electrode.

20. The OLED display of claim 19, Wherein the projecting portion extends upwardly within the via hole.

\* \* \* \* \*